United States Patent
Vinh

[11] Patent Number: 5,952,843
[45] Date of Patent: Sep. 14, 1999

[54] VARIABLE CONTACT PRESSURE PROBE

[76] Inventor: Nguyen T. Vinh, 776 N. Third St., San Jose, Calif. 95112

[21] Appl. No.: 09/047,300

[22] Filed: Mar. 24, 1998

[51] Int. Cl.[6] .............................. G01R 31/02; G01R 1/06
[52] U.S. Cl. .......................... 324/761; 324/754; 324/72.5
[58] Field of Search .................................. 324/72.5, 754, 324/757, 761, 762, 765; 439/482

[56] References Cited

U.S. PATENT DOCUMENTS

| | | | |
|---|---|---|---|
| 2,595,497 | 5/1952 | Webster, Jr. | 324/765 |
| 4,038,599 | 7/1977 | Bove et al. | 324/754 |
| 4,897,598 | 1/1990 | Doemens et al. | 324/761 |
| 4,899,099 | 2/1990 | Mendenhall et al. | 324/72.5 |
| 4,963,822 | 10/1990 | Prokopp | 324/72.5 |
| 4,967,148 | 10/1990 | Doemens et al. | 324/754 |
| 5,015,947 | 5/1991 | Chism | 324/754 |
| 5,019,771 | 5/1991 | Yang et al. | 324/754 |
| 5,055,777 | 10/1991 | Bonelli et al. | 324/754 |
| 5,218,292 | 6/1993 | Goto | 324/761 |
| 5,247,250 | 9/1993 | Rios | 324/754 |
| 5,293,516 | 3/1994 | Fouere et al. | 324/756 |
| 5,378,971 | 1/1995 | Yamashita | 324/72.5 |
| 5,394,100 | 2/1995 | Bohler et al. | 324/757 |
| 5,416,429 | 5/1995 | McQuade et al. | 324/762 |
| 5,482,038 | 1/1996 | Ruff | 439/482 |
| 5,517,126 | 5/1996 | Yamaguchi | 324/754 |
| 5,521,521 | 5/1996 | Perego | 324/72.5 |
| 5,532,614 | 7/1996 | Chiu | 324/765 |
| 5,594,357 | 1/1997 | Nakajima | 324/757 |
| 5,642,054 | 6/1997 | Pasiecznik, Jr. | 324/754 |
| 5,670,889 | 9/1997 | Okubo et al. | 324/761 |
| 5,690,998 | 11/1997 | Nagasaw et al. | 427/255.6 |

*Primary Examiner*—Diep Do
*Attorney, Agent, or Firm*—Claude A.S. Hamrick; Oppenheimer Wolff & Donnelly; Fred Zustak

[57] ABSTRACT

A wafer probe system includes a plurality of vertical-parallel probe pins having a spring formed in a center portion thereof to provide a contact force control area. The spring being formed according to a predetermined shape having a known stress-strain profile. In one embodiment, a first spring shape results in a probe tip contact force that is approximately constant after an initial vertical displacement of the probe tip. In an alternate embodiment, a second spring shape formed in the probe pin results in decreasing probe tip contact force with increasing vertical displacement of the probe tip. A canted probe tip end permits creation of an X-Y force component to facilitate penetration of the passivation layer. The canted tip portion also permits non-rotatable alignment of the probe pins in a probe card to thereby prevent contact of one probe pin with another. Impedance controlled test signal transmission lines permit enhanced high frequency testing of device under test circuits, and lower signal power requirements.

18 Claims, 7 Drawing Sheets

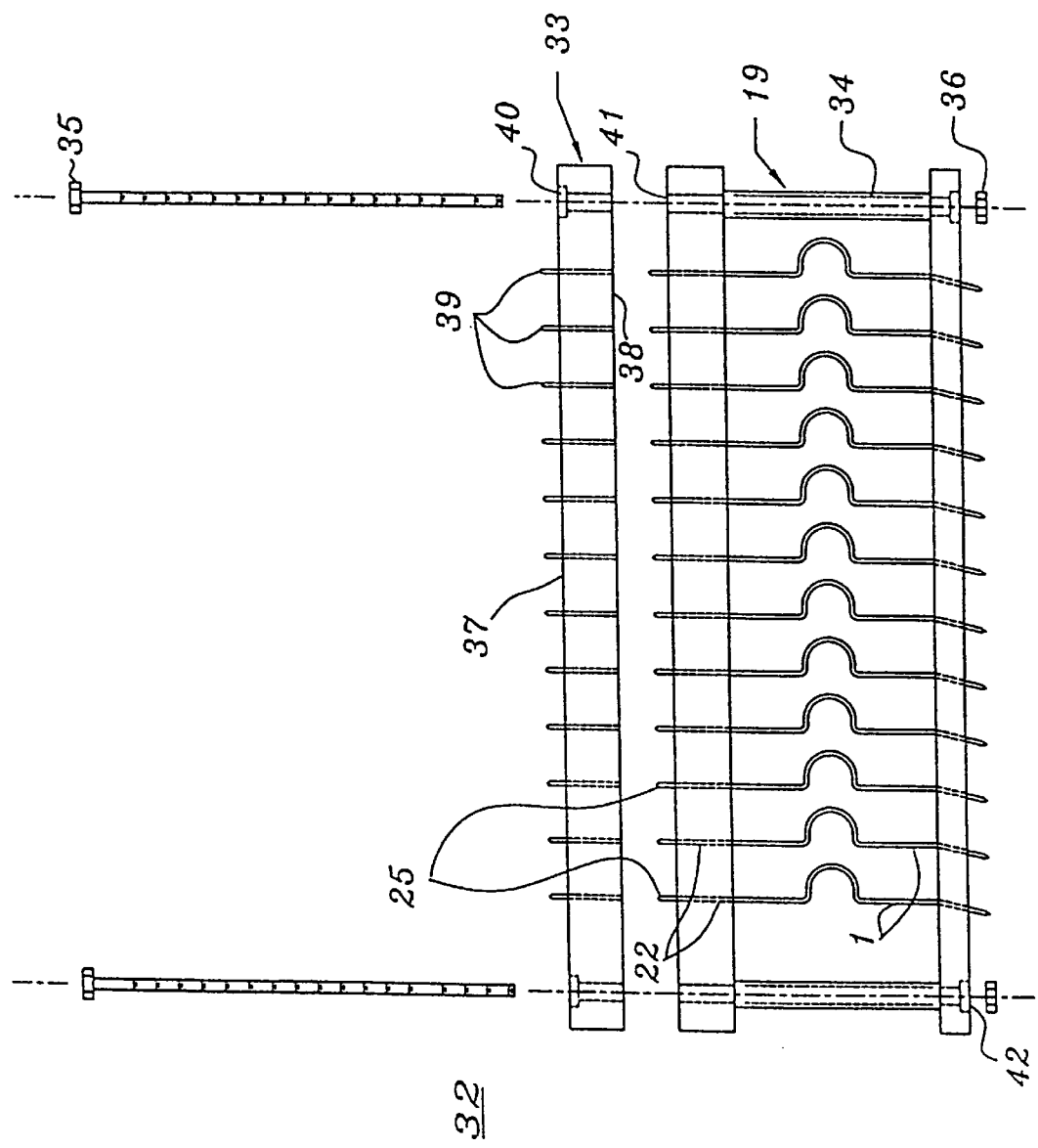

VARIABLE CONTACT PRESSURE PROBE

BACKGROUND OF THE INVENTION

1. Field of the Invention

This invention relates to semiconductor wafer probes, and more particularly to a parallel-vertical pin probe assembly having a pre-selectable, variable contact force.

2. Description of Related Art

Semiconductors devices are typically formed on a semiconductor substrate employing precise photolithographic techniques. A plurality of devices are formed on a single wafer, and the wafer sliced into separate individual devices upon completing the fabrication process. Prior to slicing, semi-finished devices are typically tested to evaluate the electrical characteristics of each device on the semiconductor wafer using a wafer probe apparatus. Increasingly complex integrated circuit designs and die pad geometries, however, require wafer probe capabilities that are unattainable using current conventional probe card technologies.

Conventional probe technologies include cantilever type probes pins and vertically-aligned probe pins. Cantilever probes comprise a plurality of substantially horizontal, cantilevered probe pins extending radially inward from a probe card. Contact pressure is determined by the amount of shear strain, or bending displacement, of the probe pin tip, and the pin's spring constant. Since the spring constant, hence the contact force, decreases with increasing cantilever length, poor or incomplete penetration of a device's inner bond pad's passivation layer may result when using longer cantilever probe pins. Accordingly, cantilever-type probes are typically design restricted to devices having peripheral device bond pads.

Other problems with cantilever-type probes associated with non-uniform cantilever pin lengths include difficulty in aligning the probe tips in the X-Y plane, and poor z-planarity of the probe tips. These problems result in imprecise probe tip placement, as well as uneven probe tip contact pressure, thus resulting in lower device yields due to bond pad damage, wire connection damage, and particulate contamination.

Another problem with cantilever probe systems is the increasing probe count, or probe pin density, necessary to accommodate increasing bond pad densities. The smaller probe pin pitch associated with these higher bond pad densities results in capacitive loading of the probe assembly. These parasitic capacitances, in turn, limits the testing frequencies which may be used, thereby precluding using high-frequency test signals. This, in turn results in only a partial assessment of the performance capabilities of the device under test.

A further problem with cantilever probe assemblies is their relatively low pin densities as compared to vertical pin-type probe assemblies, as will be discussed. The number of probe pins which can physically fit within the geometry of a high density device is limited by how closely the cantilever probe pins may be spaced. Physical limitations, such as pin diameter, pin tip spacing tolerances and the like, restrict the number of cantilever probes that may be incorporated into the cantilever probe system, thus limiting the number of bond pads which may be addressed at one time. Consequently, cantilever-type probes are typically restricted to testing only one device at a time.

Vertical probe pin cards include generally vertically aligned, straight pins arranged in an ordered, addressable array. The array coincides with the bond pad positions of the device under test. Vertical probe pin densities may be higher than cantilever-type probes, and multiple devices may be tested by one probe (i.e., grid array probing).

The contact force of vertical-type probe pins is determined by either the compressive strain of the pin, or by a spring, or resilient material, against which the end of the probe pin may act. One problem with this type of probe is that the contact force of the probe pins increases with increasing vertical displacement of the probe tip. Accordingly, to ensure uniform probe tip contact force across all bond pads, the probe tips must be carefully aligned in the z-plane; i.e., a high probe tip planarity.

Another problem with vertical probe pin assemblies is the criticality of precise vertical control of the probe assembly. The vertical position of the entire probe assembly must be precisely controlled to ensure that the probe pin contact pressure is uniform and within a predetermined contact force across all of the bond pads on the semiconductor device. The extent of the probe assembly's vertical travel must be sufficient to ensure a contact force sufficiently high to pierce the passivation layer of all the bond pads, but not be so far as to exert excessive contact pressures which might damage the probe, the bond pad, or nearby wire connections. This vertical displacement criticality arises, in part, as a result of the compressive strain spring constant of vertical-type probe pins. Since contact force is proportional to probe tip vertical displacement, precise control of the vertical travel of the probe assembly is necessary to ensure uniform contact force, and penetration of the passivation layer at each bond pad.

The ability of vertical-pin probe tips to penetrate the passivation layer of the bond pad is aggravated in that the vertical displacement of the probe tip does not create an X or Y force component to allow the probe tip to "shear" through the passivation layer. Consequently, vertical pin probe tips crush the passivation layer in order to establish electrical contact between the probe tip and the bond pad. As a result, relatively higher contact forces are needed to pierce the passivation layer. This in turn results in lower device yields due to an increased likelihood of damage to the bond pads and connecting wires, and increased particulate contamination.

Another problem with vertical pin probes arises as the bond pad density increases with increasing integration density of a semiconductor device. The resulting increase in the number of probe pins needed to test the semiconductor device exerts a correspondingly increased cumulative force on the semiconductor device and probe card. For example, in the case of a probe card having 500 probe pins, a force of 5 grams exerted by each probe pin results in a cumulative force of about 2.5 kilograms exerted on the device under test and on the entire probe card. As the number of probe pins increases even further, the vertical load on the probe card also increases resulting in possible deformation of the probe assembly, which in turn degrades probe tip planarity.

Various attempts to address the aforementioned problems have been tried, including modifying the probe pin. One manufacturer, Cerprobe Corporation, (Gilbert, Ariz.) utilizes a modified probe pin in their Cobra Probe™ probe card. The contact wire used in the Cobra Probe™ includes an arcuate center section and probe pin tip, and a substantially linear connector end for electrical communication with electron test equipment. Accordingly, the angle of the probe pin tip to the longitudinal axis of the linear connector end is determined by the chord angle of the arcuate section of the probe pin. The cross section of the probe pin varies along its length; i.e., a circular cross-section at the probe tip end and the linear end, and a rectangular cross-section in the arcuate center portion of the probe pin. The connector end is terminated in a flared, flattened terminus.

The probe pin pitch of a probe card is limited by the size of the via hole in an alignment plate through which the probe tip must pass. The Cobra Probe™ cards pass their probe tips through a via hole that is perpendicular to the plane of a lower guide plate. These via holes have a diameter sufficiently large to permit the angled passage of the probe tip. Accordingly, the diameter of the via-hole is substantially larger than the width of the probe pin. However, the larger diameter of these via holes limits the hole pitch (hole-to-hole spacing) thereby limiting the probe pin array density. This limitation is inconsistent with the smaller bond pad pitch of high density semiconductor devices which necessitate greater probe pin densities.

Another problem with the above described probe pins is that they require additional process steps and expense in ordered to form the varied cross-sections. These additional steps increase manufacturing cost and complexity.

A further problem with the vertical probe pin described above is the coupling of the geometry of the arcuate spring section of the probe pin and the contact angle of the probe pin tip on the bond pad. The contact angle of the probe tip with the bond pad is dependent on the spring geometry. Since the stress-strain profile of the arcuate section of the Cobra Probe™ contact wire is dependent on the angle and chord length of the arc, and since the probe pin tip is part of the chord length of that arc. As a result, the contact angle may be smaller than desired, resulting in insufficient lateral scrub force to pierce the passivation layer, or it may be larger than desired resulting in decreased yields due to pad or wire damage. Also, as pad geometries decrease, the scrub mark left by the probe pin tip must decrease as well. This would require that the arcuate section of the Cobra Probe™ contact wire include a smaller chord angle to thereby reduce the angle at which the probe tip addresses the bond pad. This coupling of the angle of the arcuate portion of the spring and the probe tip angle places significant design restrictions on the probe pin, and limits the range of contact pressure that may be used for a given probe tip angle.

Accordingly, there is a need for a wafer probe assembly having a high pin density, and selectable contact force. There is also a need for a wafer probe assembly wherein the probe tip angle may be decoupled from the remaining spring geometry to accommodate smaller pad sizes without affecting the spring's stress-strain profile. There is also a need for a wafer probe assembly whereby the cumulative contact force may be controlled even as probe pin count/density increases.

SUMMARY OF THE INVENTION

The wafer probe assembly of the present invention provides an impedance balanced, pre-selectable contact pressure, electrical probe interface between device dies on a semiconductor wafer and electronic test systems to permit testing functionality and performance of integrated circuits on a semiconductor die. The wafer probe assembly of this invention is scaleable to enable testing a single die, concurrent testing of a plurality of dies, or concurrent testing of all dies on a semiconductor wafer.

The wafer probe assembly includes a connector plate, and a probe card having an upper and lower alignment plate, and a plurality of probe pins. The plurality of pins are arranged vertically between the two alignment plates in ordered-array, parallel, fixed spatial relationship with one another to provide an electronically addressable array of probe pins. The probe pins are further arranged in a mirror image array to the array orientation of the conductive bond pads on the semiconductor devices to be tested.

In accordance with one aspect of the probe pin of this invention, the probe pin includes a test (or tip) end, a connector (or proximal) end, and a center section. At least a portion of the center section of the probe pin is formed into a spring having a pre-defined shape. The shape of the spring is selected to provide a pre-determined stress-strain profile with vertical (or z-direction) displacement of the probe pin tip to provide a known, predetermined probe pin tip contact force. In some embodiments, the spring is formed so that the pre-selected contact force is attained within the first approximately 50 microns of probe tip vertical displacement (the initial overdrive), and remaining essentially constant with further displacement of the probe tip. Advantageously, a spring having these characteristics eliminates the need for critical planar alignment of the probe tips in a probe assembly. This constant contact force probe pin ensures that the contact force will be the same for all probe pins after all of the probe pin tips have been displaced by at least the initial overdrive distance.

In other embodiments, a spring geometry whereby the contact force decreases with increasing vertical displacement beyond the initial overdrive distance is selected. These embodiments advantageously permit specifying a maximum contact force per pin at the initial overdrive (the z-displacement of the probe tip) to permit penetration of the passivation layer, followed by a reduction in the contact force as the probe pin vertical displacement passes through the initial overdrive.

In some embodiments, the probe pin tip is canted, or bent, at an angle of about 0 degrees to about 12 degrees to that of the longitudinal axis of the probe pin. The canted tip advantageously creates an X-Y shear force component from the z-direction stress on the canted probe tip as it is brought into contact with bond pad of the device under test. The X-Y force is predetermined from the cant angle of the probe pin tip and the z-direction contact force, and is sufficiently high to pierce the passivation layer of the integrated circuit device, thereby ensuring good electrical contact of the probe with the circuit under test. The length of the scrub mark resulting from the lateral movement of the probe tip across the bond pad is conveniently controlled by adjusting the tip cant angle. A smaller scrub mark minimizes contact damage to the semiconductor contact pad elements, causing less damage to wire bonds and reduced particulate contamination, resulting in higher device yields.

In other embodiments, bump bond pads reduce the need for a canted probe-tip In those applications, the probe pin of this invention includes a non-canted pin tip (the tip's longitudinal axis is parallel to the longitudinal axis of the probe pin), or else the probe pin tip is canted only slightly. Either a straight probe tip, or a probe tip having a small cant angle, in cooperation with the non-planar surface, is sufficient to create a force component parallel to the surface of the bump sufficient to pierce the passivation layer.

The cant angle of the probe pin tip determines the relative magnitude of the X-Y shear force to the vertical contact force, and is approximately equal to $F \cdot \sin\theta$ (where F is the total contact force coincident with the longitudinal axis of the tip, and $\theta$ is the angle between the longitudinal axis of the probe pin and the longitudinal axis of the canted tip portion of the probe pin). Advantageously, the probe pin of this invention decouples the probe tip from the centrally disposed probe pin spring (i.e., the canted probe pin tip is not part of the spring). As a result, the cant angle of the probe tip is selectable independent of the shape and stress-strain characteristics of the centrally located spring. This decoupling permits selecting any cant angle, or forming any spring type without requiring design accommodations or compromises to the other element. This in turn permits selecting any probe pin contact stress-strain profile for any probe pin/bond pad contact angle.

The probe pins of this invention are advantageously fabricated from a stiff, elastic, electrically conductive filament or wire. The stress-strain characteristics of the material chosen include elastic strain behavior in the stress ranges anticipated by the probe pin spring. Also, the critical shear stress of the selected wire is above the maximum anticipated probe pin contact force. Accordingly, wire diameters ranging from about 40 microns ($\mu$m) to about 170 $\mu$m may be used depending on the desired probe pin contact force and the desired stress-strain profile of the spring formed on the wire. In some embodiments, a commercially available metal wire, Paliney 7®, manufactured by J.M. Ney Co. and distributed by STI, Incorporated (Marlboro, N.J.), exhibits the desired mechanical and electrical characteristics (e.g., high elasticity, high critical shear stress point, and electrically conductive) and may be selected for forming the probe pins of this invention. Paliney 7® is a precious-metal alloy comprised of gold, platinum, palladium, silver, copper, and zinc. Other materials suitable for fabricating the probe pin of this invention include other metals such as gold and platinum and their alloys, stainless steels, tungsten, tungsten alloys, nickel alloys, metal plated laminates, electrically conductive plastics and electrically conductive polymer composites.

The probe card of this invention includes an upper alignment plate, a lower alignment plate, and a plurality of probe pins. The probe pins are substantially vertically arranged in a parallel, ordered, spatially-fixed array between the top and bottom alignment plates. The upper alignment plate includes a top surface and a bottom surface, and a plurality of through holes having diameters sufficient to provide removable, snug-fit retention of the connector ends of the plurality of probe pins. Each probe pin is removable from the upper alignment plate to permit replacement or deletion of the probe pin at that array location in the event the probe pin is damaged or a change in the probe pin array layout is desired.

In accordance with one aspect of the probe card of this invention, the lower alignment plate includes an upper surface, a bottom surface, and a plurality of through-holes connecting the upper and bottom surfaces. The through-holes are formed at an angle to the perpendicular, the angle being equal to the cant angle of the tip of the probe pins. The lower plate through-holes are arranged in mirror image array with the upper alignment plate through holes to permit slidably retaining at least a portion of the canted tip end of the plurality of probe pins. The lower alignment plate through-holes act as sleeves for the canted tips of the probe pins, and accordingly, have a diameter sufficient to permit longitudinal movement of the canted tip with substantially no transverse movement of the canted tip in the through-hole.

Since the guide sleeves have an inside dimension just slightly larger than the diameter or circumferential geometry, of the probe pin, the guide sleeve diameters are sufficiently small to allow a small guide sleeve pitch (inter-hole distance), thereby permitting high pin counts, and high pin density. In one embodiment of the probe card of the present invention, 85 $\mu$m diameter guide sleeves are bored in the lower alignment plate to accommodate 76 $\mu$m diameter probe pins, to provide a hole pitch of approximately 100 $\mu$m or less. Since the guide sleeve pitch is independent of the probe pin spring geometry, the hole-pitch is advantageously decoupled from the probe pin contact force to permit specifying a wide range of probe pin contact forces independent of the guide sleeve hole pitch.

The lower and upper alignment plates may be formed from any insulating material including, but not limited to, electrically non-conducting plastics, ceramics, or composite materials. The lower alignment plate is between 6 millimeters to about 12 millimeters thick, or otherwise sufficiently thick to limit movement of the probe pin tip to longitudinal movement along the probe pin tip longitudinal axis, yet thin enough to permit the probe pin tip to extend beyond the bottom surface of the lower alignment plate by a distance greater than the anticipated maximum vertical displacement of the probe tip, typically greater than about 75 $\mu$m.

The wafer probe assembly of this invention includes the probe card of this invention as discussed above, and a connector plate for permitting transmission line connection of the probe card with electronic test equipment. In some embodiments, the connector plate includes a plurality of electrically conductive through-pins arranged in mirror image array to the plurality of probe pin connector ends projecting from the top surface of the upper alignment plate. A bottom surface of the connector plate is disposed opposite the top surface of the upper alignment plate to thereby permit electrical connection of the connector end of each of the plurality probe pins with a corresponding end of a respective conductive through pin in the connector plate.

The bottom surface of the connector plate is aligned with and releasably secured against the top surface of the upper alignment plate using removable securing means such as bolts, screws, clips, non-permanent cement, solder, and the like. The connector end of each probe pin extends perpendicularly outward from the top surface of the upper alignment plate for a distance sufficient to engage a corresponding through-pin in electrical communication. Accordingly once secured in place, the terminus of the connector ends of the plurality of probe pins are urged against the conductive pins of the connector plate to provide electrical communication between the probe pins and the conductive pins of the connector plate. A plurality of transmission, or signal, lines are attached to the opposite ends of the conductive through-pins to permit transmission of electrical signals to and from electronic test equipment.

In some embodiments the connector plate includes conductive through pins or vias that are perpendicularly aligned to the top and bottom surfaces of the connector plate in mirror image array to the probe pin connector ends extending from the top of the upper alignment plate. In other embodiments, in particular where probe pin densities are high, the conductive pins are flared out in a generally radial direction through the thickness of the connector plate to provide an enlarged array of conductive pin ends on the connector plate upper surface. By increasing the pitch between the ends of the conductive pins this enlarged array facilitates connection of the connector block to electronic test equipment.

In accordance with another aspect of the wafer probe assembly of this invention, the connector plate conductive through-pins provide substantially direct electrical communication between the probe pins populating the probe card and the signal lines connecting the conductive through-pins of the connector plate to electronic test equipment. In some embodiments, flexible circuit, impedance-controlled signal lines carry test signals from the conductive through-pins of the connector plate to electronic test equipment. The impedance for each signal line in the flexible circuit is advantageously matched to the impedance of the device under test at each of the device's bond pads. It is understood by those skilled in the art that the inductive and capacitive loads (characteristic impedance) of a transmission line are controllable using well known techniques, including controlling transmission line run length, controlling inter-line spacing, choice of dielectric material insulating material, and proximity of the line to a ground plane. The direct connection of the probe assembly's connector plate to the impedance controlled transmission lines results a lower characteristic impedance for each signal line, as well as providing a substantially constant characteristic impedance value across all signal lines. The improvement in the characteristic impedance in the lines connecting the probe assembly to the electronic test equipment in turn results in reduced signal reflections in the connection lines and enhanced power utilization. These factors, in turn. advantageously result in reduced signal attenuation, enhanced uniformity of signal strength, and increased digital signal frequency transmission capability.

In other embodiments, the conductive through-pins are urged against contact pads in a probe pin contact array on a printed circuit board formed on an interface assembly, typically a pogo pin tower. The interface assembly connects the electronic test equipment with the probe assembly, thereby providing electrical communication between each of the plurality of probe pins and the electronic test equipment. The signals channels in these embodiments include the traces extending from printed circuit board contact pads and the pogo pads typically arrayed on the perimeter of the pogo pin tower. These traces may be impedance controlled using the design techniques described above.

In yet other embodiments, the connector plate is removed and the probe card is secured to the probe pin contact array of the printed circuit board interface card. In these embodiments, the connector terminus of each probe pin is in electrical communication with a contact pad in the probe pin contact array.

BRIEF DESCRIPTION OF THE DRAWINGS

The present invention may be better understood, and its numerous objects, features, and advantages apparent to those skilled in the art by reference to the accompanying drawings.

FIG. 5A is an exploded view of one embodiment of the wafer probe assembly of this invention.

DETAILED DESCRIPTION

While the invention described hereinbelow is made with reference to certain illustrated embodiments, it is understood that these embodiments are presented by way of example and not by way of limitation. The intent of the following detailed description is to cover all modifications, alternatives and equivalents as may fall within the spirit and scope of the invention.

Figure 1A:
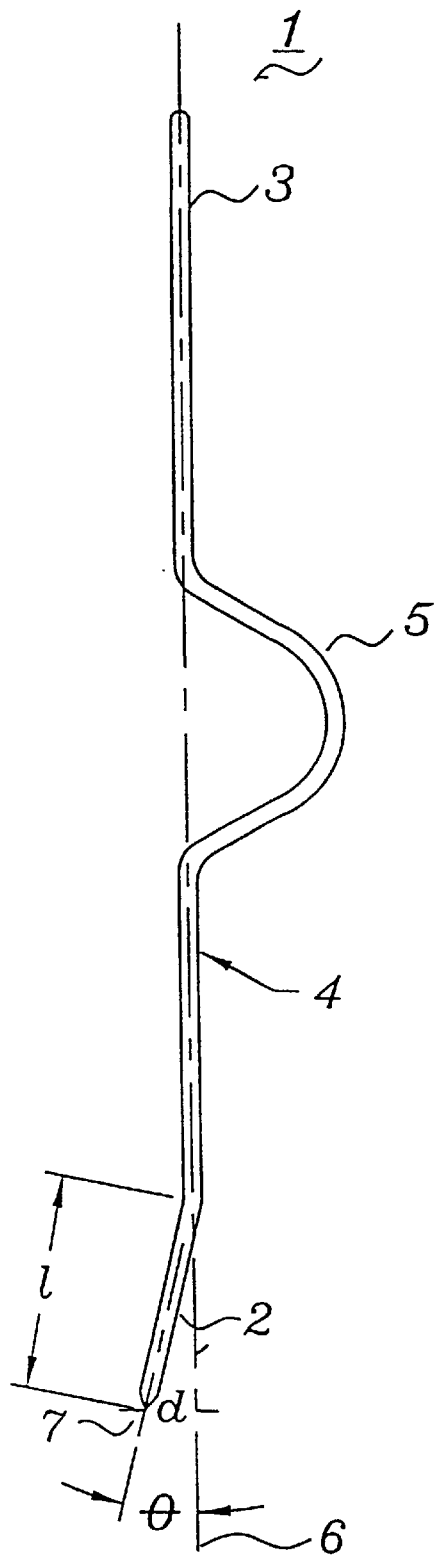
FIG. 1A is a side view of a probe pin of the present invention showing one embodiment of a spring formed on a medial portion of the probe pin.

A better understanding of the structure and operation of the probe pin of this invention may be had by referring to FIG. 1A. The probe pin 1 includes a tip end 2, a connector end 3, and a medial section 4. The medial section includes a contact force control area 5 formed from the wire material comprising the probe pin 1. It is understood that the probe tip terminus 7 of tip end 2 may be pointed (as shown), or radiused.

The tip end 2 is canted at an angle $\theta$ from the longitudinal axis 6 of the probe pin. The degree of cant is selectable to provide a pre-determined X-Y shear force component as described above. The tip has a length "l" sufficiently long to transverse a guide sleeve in a lower alignment plate (not shown) and to extend downwardly from the bottom surface of the lower alignment plate by at least 75 $\mu$m. As shown in the embodiment of FIG. 1A, the canted tip end 2 results in the probe tip terminus 7 being offset from the longitudinal axis 6 by a distance "d." Since the probe tip must align with the bond pad of the device under test, it is understood that a probe assembly alignment process must consider the tip offset.

Figure 1B:
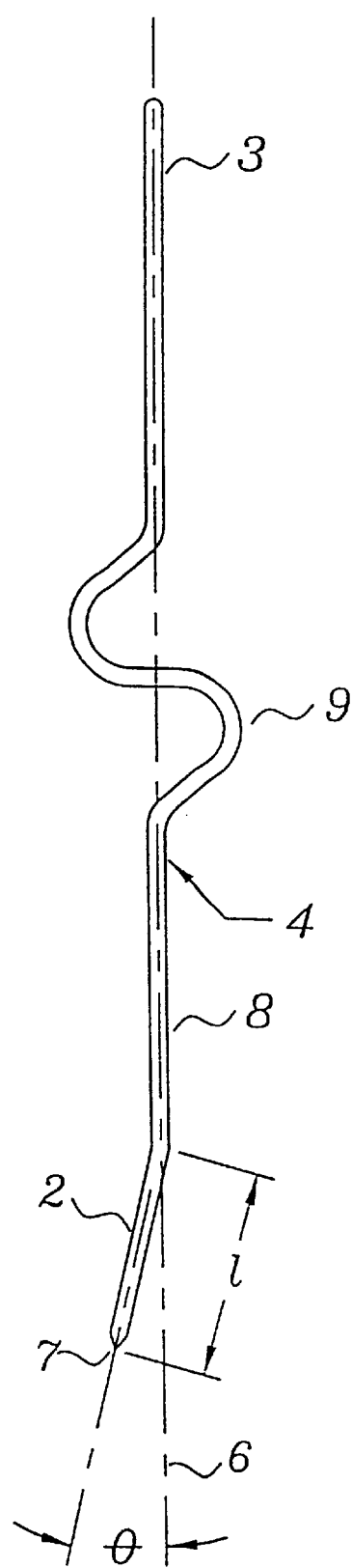
FIG. 1B is a side view of the probe pin of the present invention showing an alternate embodiment of a spring formed on a medial portion of the probe pin.

FIG. 1B shows an alternate probe pin embodiment wherein a bottom portion 8 of the medial section 4 is offset from the probe pin's longitudinal axis 6 by an amount equal to the probe tip offset. As a result, the probe tip 7 is conveniently coincident with the longitudinal axis 6 to thereby facilitate alignment of the probe tip 7 with the bond pads (not shown) of the device under test. An alternate spring configuration 9 is shown to illustrate the variety of spring shapes that may be formed in the medial section of the probe pin, and to show how the spring may be configured to eliminate offset to the probe tip terminus 7.

Figure 2:
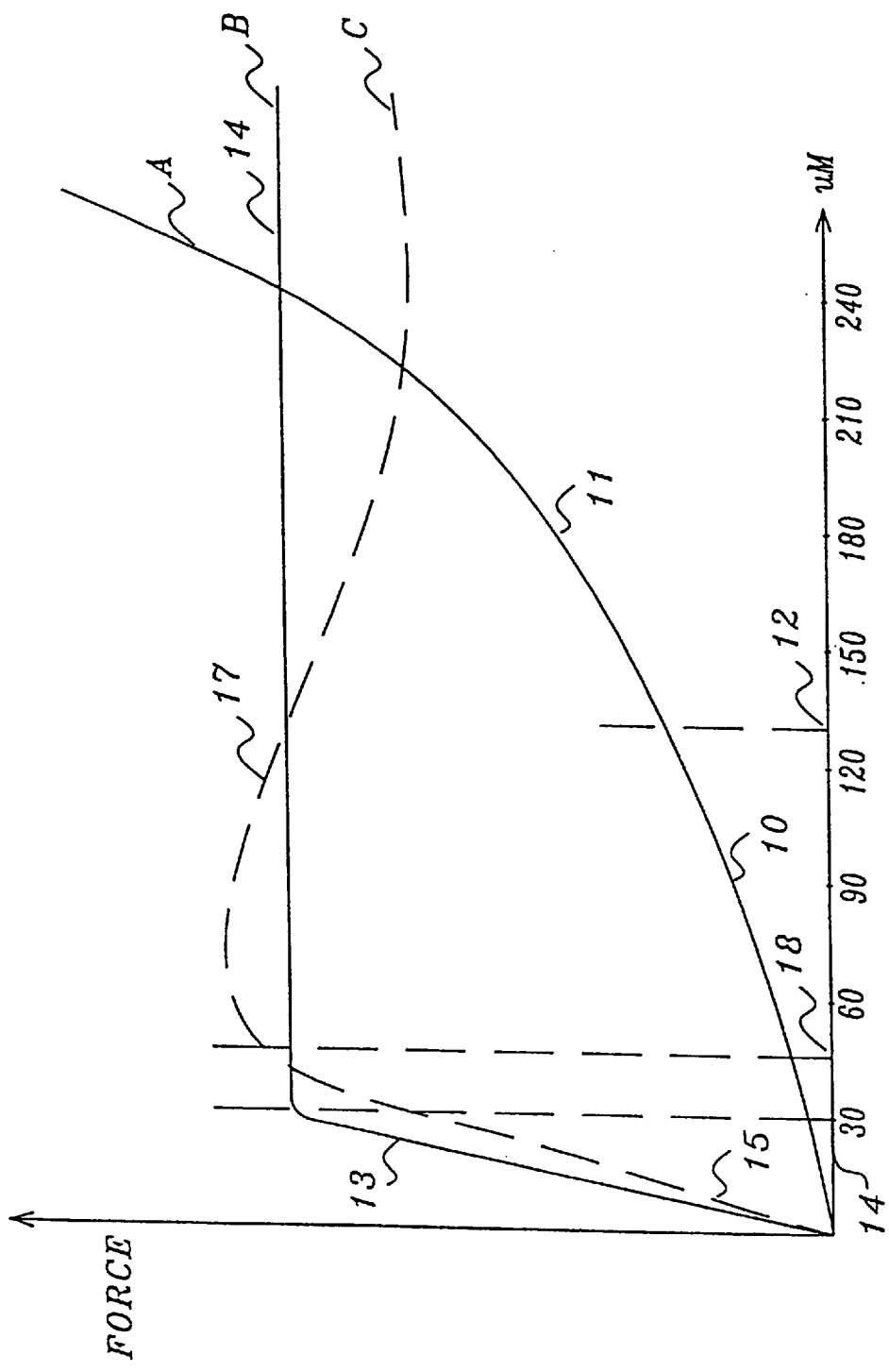
FIG. 2 is a stress-strain diagram showing various z-displacement/contact force profiles for various spring shapes and types.

FIG. 2 is a graph showing the stress-strain diagrams for a cantilever-type probe as compared to two alternate spring types which may be formed in the probe pin of this invention. Stress-strain curve A is typical of a cantilever-type probe. This probe is typified by a strain region 10 wherein the stress force (i.e., the contact force) is a linear function of the vertical displacement. If the z-displacement of the cantilever probe tip exceeds the maximum z-displacement 12 for the linear region, the stress force is no longer a linear function of the z-displacement, as shown by the non-linear stress-strain portion of the curve 11. Should the z-displacement become large enough, deformation or fracture of the cantilever spring will occur.

By comparison, the springs in the probe pin of the this invention may be formed to exhibit a much broader range of stress-strain relationships. Stress-strain profile B is associated with a spring characterized by a linear region 13 wherein the spring force is linear with increasing z-displacement. After an initial vertical displacement 13, additional z-displacement of the probe tip results in very small or negligible increases in stress, as shown by region 14. This spring stress-strain profile is conveniently used in some embodiments of the probe pin of the present invention to provide a constant contact force and to substantially eliminate the criticality of co-planarity of all of the probe tips. It also, substantially eliminates contact force differences associated with device bond pads positioned at various z-displacements. The spring shown in FIGS. 1B, for example, may be formed to exhibit this stress-strain profile.

The stress-strain profile C is associated with a spring shape that results in a linearly increasing stress during an initial z-displacement region 15, and a decreasing contact force as the z-displacement increases, as shown by region 17, after the initial displacement value 18 is reached. This spring type is conveniently used where an initially high stress may be desirable to pierce the passivation layer of the bond pad, and a subsequently lower contact force with increasing z-displacement of the probe tip. This stress/strain profile results in less damage to, or contamination of, the device under test. Springs exhibiting elastic buckling characteristics are well known. The spring 5 shown in FIG. 1A, for example, may be formed such that elastic bucking behavior is attained.

Figure 3:
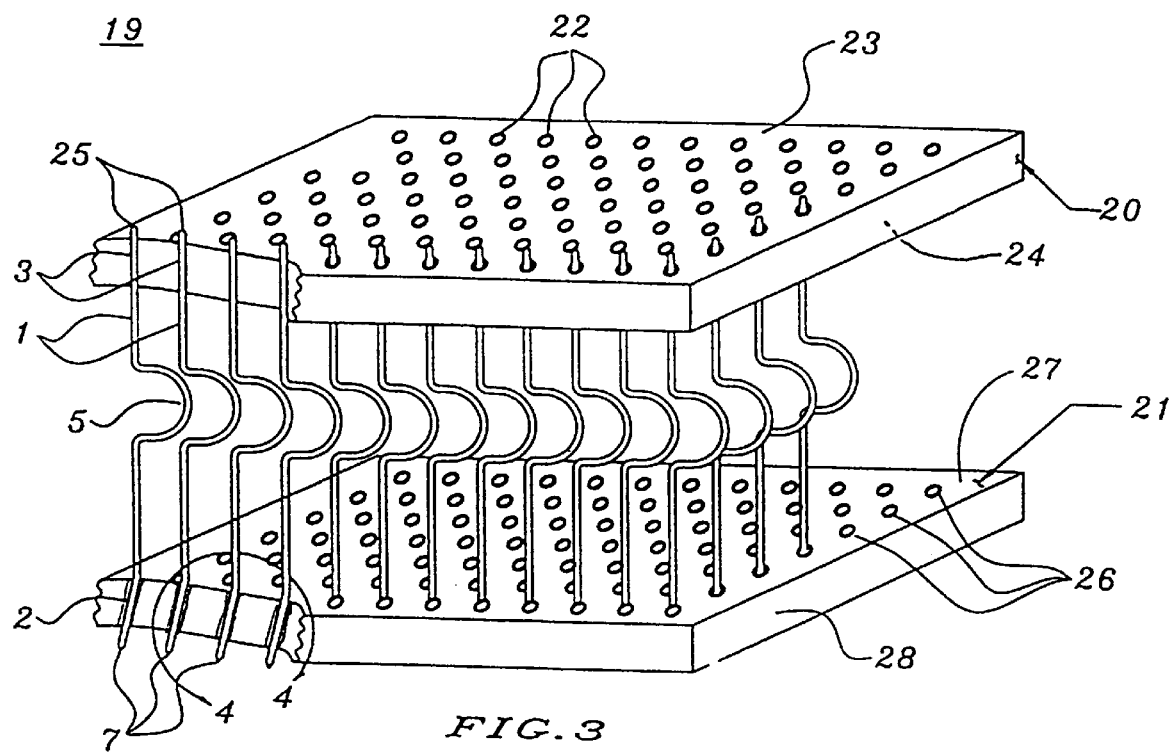
FIG. 3 is a cutaway perspective diagram conceptually showing the probe card of this invention.

FIG. 3 is an isometric conceptual view of one embodiment of the probe card 19 of the present invention. The probe card 19 includes an upper alignment plate 20, a bottom alignment plate 21, and plurality of probe pins 1 disposed between the upper and bottom alignment plates in spatially-fixed, vertical, parallel alignment. The upper alignment plate includes a plurality of through-holes 22 arranged in an addressable array. Each of the plurality of through-holes 22 is aligned perpendicularly to a top surface 23 and bottom surface 24 of the upper alignment plate. At least a portion of the upper alignment plate through-holes are selected to receive the connector ends 3 of a plurality of the probe pins 1 of this invention. The connector ends 3 are retained in snug, non-slidable, removable fit in its corresponding through-hole 22. In one embodiment, and as shown in FIG. 3, the connector end terminus 25 of each of the probe pins extends outwardly from the top surface 23 of the upper alignment block. This extension of the connector end above the top surface of the alignment block facilitates electrical connection of the probe pins with a connector plate (not shown) or for direct electrical connection to a probe pin contact array on a printed circuit board interface cord (not shown) as discussed below.

The lower alignment block 21 includes a plurality of through-holes, or guide sleeves, 26 arranged in mirror image array to the through-holes 22 of the upper alignment plate. Each of the lower alignment plate guide-sleeves 26 is disposed at an angle θ to a perpendicular between an upper surface 27 and a bottom surface 28 of the lower alignment block 21. The angle of the guide sleeve 26 is equal to the cant angle of the tip of the probe pin so that the tip 2 of each of the plurality of probe pins is slidably disposed in a respective one of the plurality of lower alignment plate guide sleeves to provide an addressable array of parallel/ vertical probe pins. The probe tips extend downwardly from the bottom surface 28 of the lower alignment plate 21. Each of the probe tip termini 7 are at substantially the same distance from the lower alignment plate bottom surface 28 to define a substantially planar array of probe tips.

Figure 4:
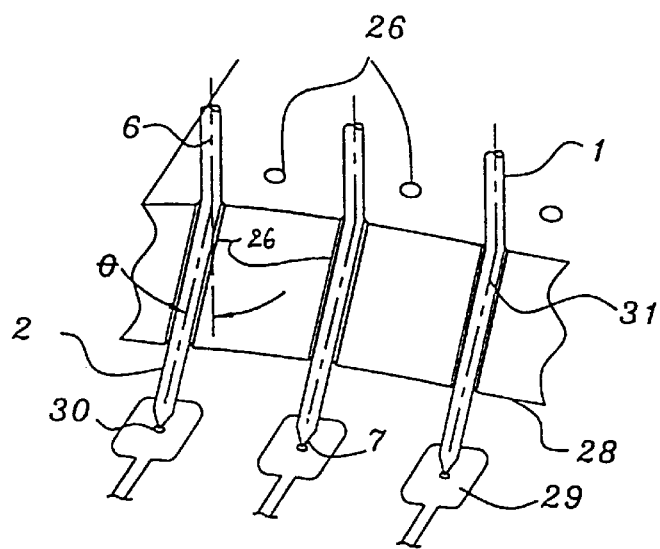
FIG. 4 is a detail diagram showing the relationship of the canted tip of the pin probe and the guide sleeves in the lower alignment plate.

As better seen in FIG. 4, the tip 2 of each probe pin 1 extends downwardly from the bottom surface 28 of the lower alignment plate 21 for a distance sufficient to ensure that all probe tips can be vertically displaced to a z-displacement in excess of the maximum anticipated z-displacement. As a result, for a constant pressure spring, all of the probe pin tips 7 exert approximately the same contact force on the device bond pads 29 (shown in phantom) after the z-displacement for all of the probe pins has exceeded the initial displacement value. This effectively eliminates the criticality of probe tip planarity and probe card vertical height control. The cant angle θ of the tip of the probe pin will, in part, determine the length of the scrub mark 30 on the bond pad 29 (i.e. the length of the scrub mark is equal to the product of the z-displacement and tan θ).

Also, FIG. 4 clearly shows the tips 2 of the probe pins 1 slidably disposed within the guide sleeves 26. The diameter of each guide sleeve 26 is sufficiently large to permit displacement of the tip 2 in the guide sleeve 26 along the longitudinal axis 31 of the tip. As can be clearly seen, the diameter of the guide sleeve substantially eliminates lateral movement of the tip 2 transverse to the tip longitudinal axis 31. Advantageously, the guide sleeve diameter, being only slightly larger than the diameter of the probe pin, permits a small guide sleeve pitch (i.e., closer hole spacing) to enhance the probe pin density in the probe card.

FIGS. 3 and 4 clearly show that each of the lower alignment plate guide sleeves 26 lie in the same direction. Accordingly, the intersection of the probe pin's major longitudinal axis 6 with the probe tip longitudinal axis 31 defines a plane. This conveniently aligns each of the plurality of probe pins in fixed, non-rotatable spatial relationship with one another. Thus, the pins may be aligned such that the contact force control areas (the spring portions) do not interfere with one another, thereby minimizing the possibility of electrically short-circuiting adjacent probe pins.

FIG. 5A is an exploded cross-section view of the probe assembly 32 of the present invention and includes the probe card 19, a connector plate 33, upper and lower alignment plate spacers 34, and plate assembling means comprising bolts 35 and machine nuts 36.

The connector plate includes a plurality of electrically conductive though-pins 39 extending from the bottom surface 38 of the connector plate to a top surface 37 of the connector plate. The through-pins are arranged in mirror image array to the upper alignment plate through-holes 22. The probe assembly is assembled by securing the connector plate onto the upper alignment plate by passing bolts 35 through bolt through-holes 40, 41, and 42 disposed in the corner regions of the connector plate 33, the upper alignment plate 20, and the lower alignment plate 21l respectively. The alignment plate spacers 34 are bored through to permit passage of the bolts 35. Nuts 36 are tightened onto bolts 35 to thereby align the connector plates and the upper and lower alignment plates in fixed spatial alignment, and with a force sufficient to urge the terminus ends 25 of the probe pins 1 against a corresponding end of the conductive through-pins 39 to thereby provide electrical communication between the plurality of probe pins 1 and the conductive through pins 39. The through pins extend outwardly from the upper surface 37 of the connector plate 33 for distance sufficient to permit connection to a flexible circuit signal cable (not shown).

It is understood that variations of the above embodiment include other assembling means such as adhesives, clamps, retaining clips, and the like. The conductive through-pins may also be spring loaded thereby self-compensating for height irregularities of the probe terminus ends 39.

Additionally, guide pins and corresponding guide-pin holes may be provided as between the upper alignment plate and the connector plate to facilitate alignment of these two plates during assembly.

Figure 5B:
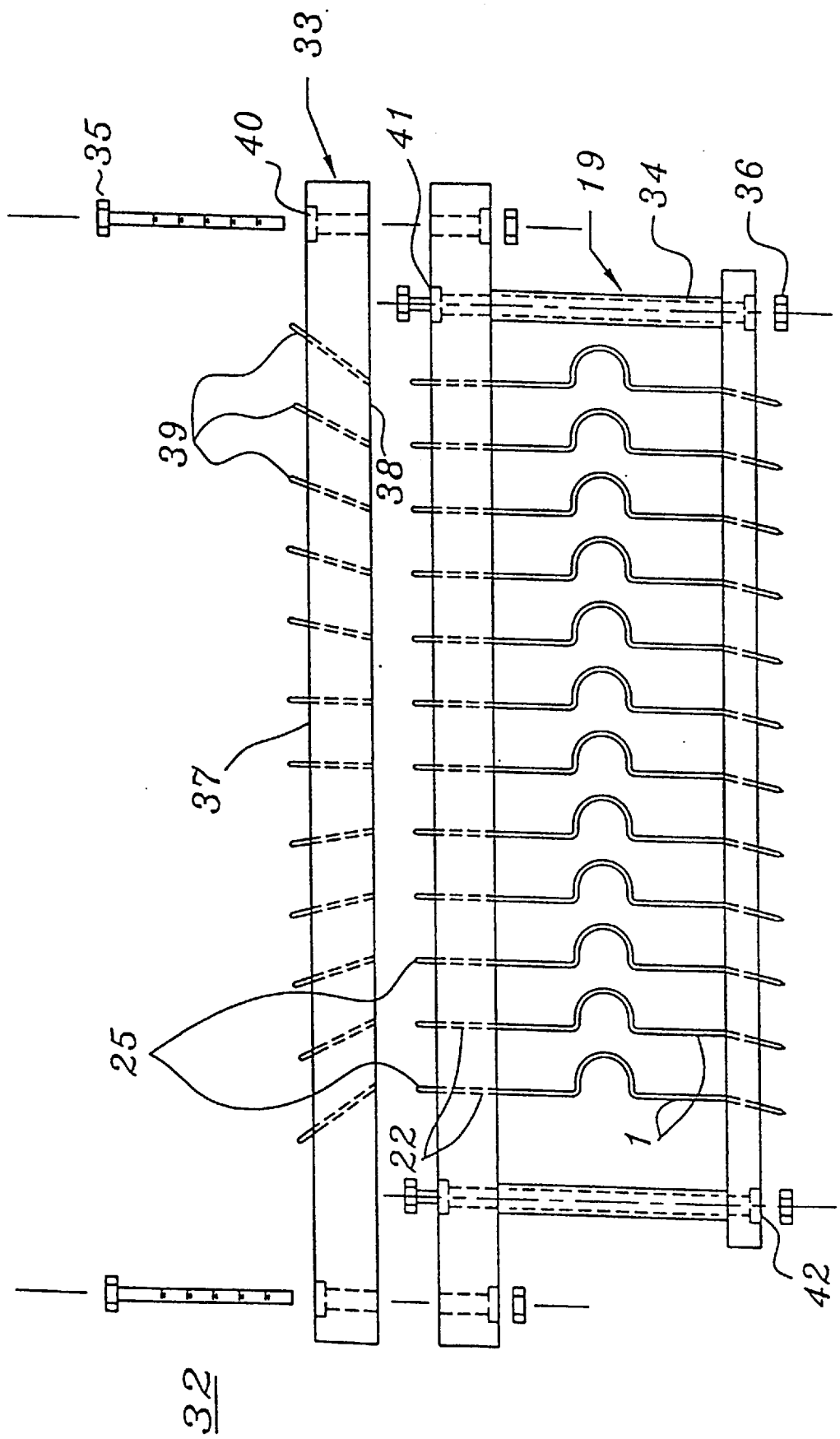
FIG. 5B is an exploded view of another embodiment of the wafer probe assembly of this invention.

FIG. 5B is an exploded cross-section diagram of another embodiment of the probe assembly of the present invention wherein the conductive through pins 39 extend through the connector plate 33 such that the array pattern defined by the conductive through-pin ends 39 extending from the top surface of the connector plate is enlarged as compared to the probe pin array (defined by the connector ends 22 extending from the top surface of the upper alignment plate) thereby facilitating connection of the through pin ends 39 to an electronic test equipment interface (not shown).

Figure 6:
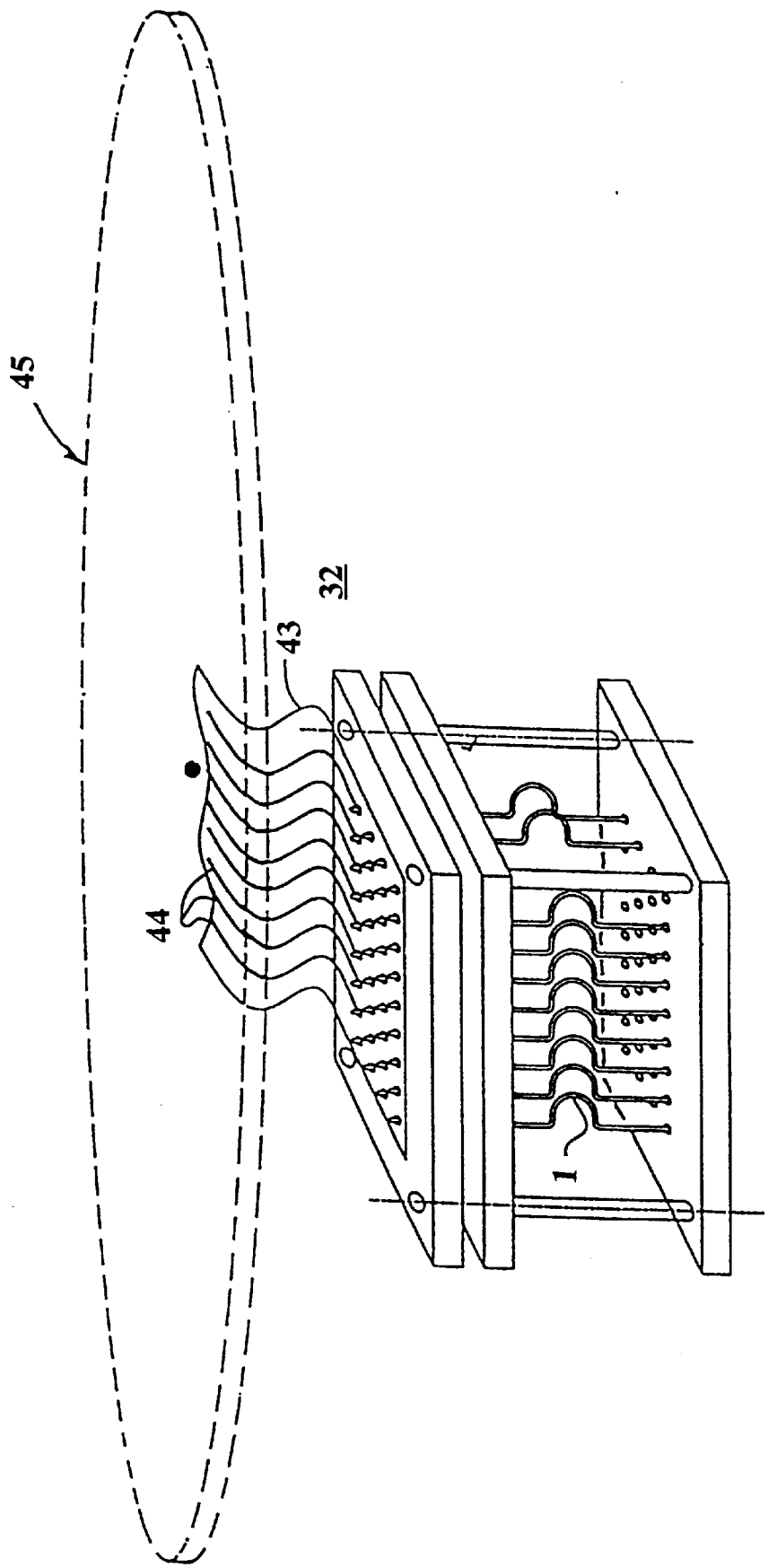
FIG. 6 is a perspective conceptual view of the wafer probe assembly of this invention showing a flexible circuit attached to the conductive through-pins of the connector plate.

FIG. 6 is an isometric view of the probe assembly 32 of the present invention showing a flexible circuit 43 solder connected to the conductive through-pins 39 to permit electrical signal transmission from the probe assembly to an electrical test equipment interface card 45. In the embodiment shown, a plurality of electrically conductive traces 44 are formed on the flexible circuit 43 to interconnect each addressable probe pin 1 to a corresponding terminal on the interface card 45. In another embodiment, a socketed flexible circuit may be clipped onto the conductive pins thereby removably connecting the flexible circuit to the probe assembly. The characteristic impedance of each trace is controlled using well known circuit design techniques such as using a ground plane in the flexible circuit, controlling spacing between traces, and the appropriate choice of insulating material.

Figure 7:
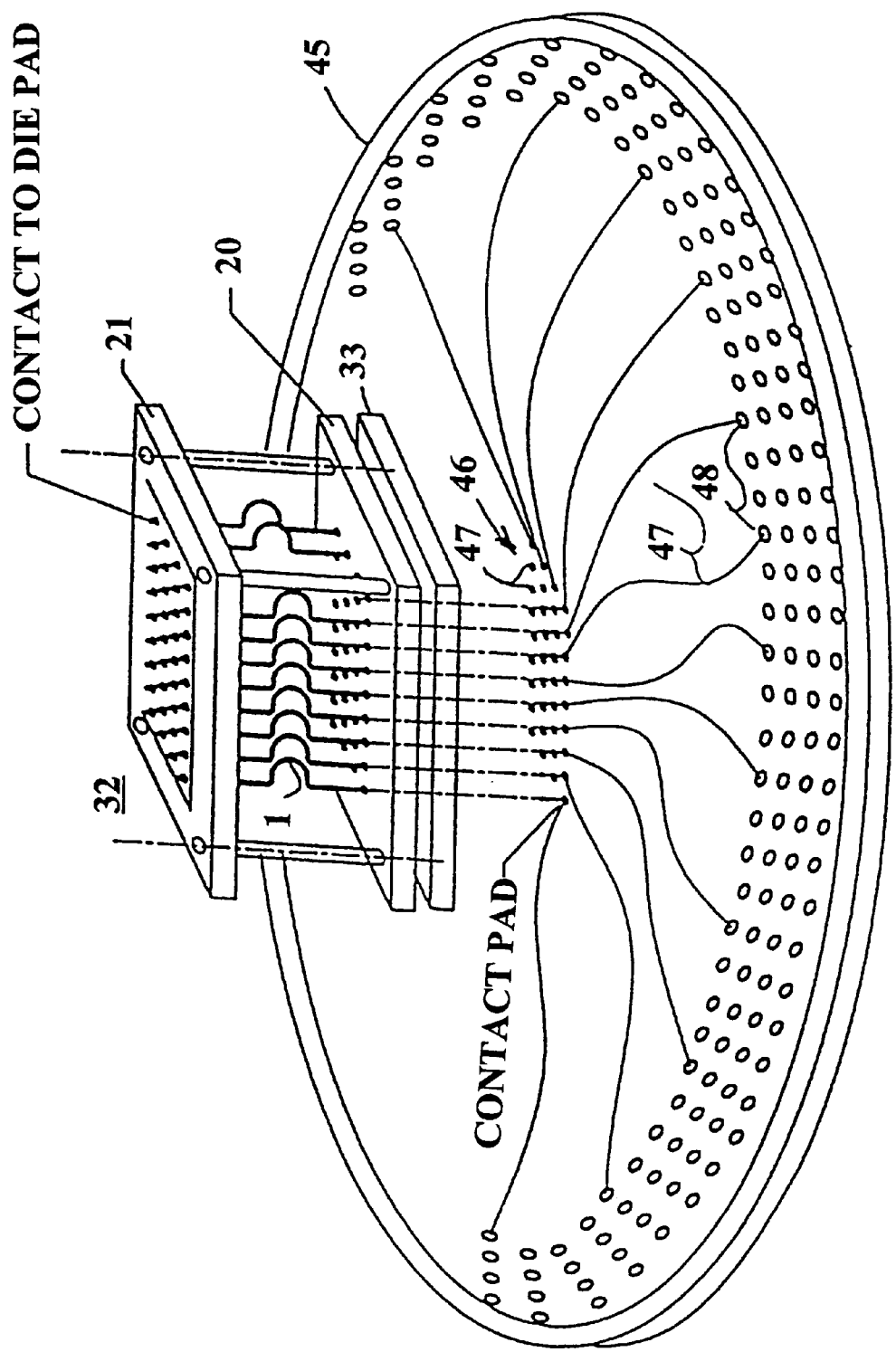
FIG. 7 is a perspective exploded view of a wafer probe assembly of this invention showing the water probe assembly attached to a printed circuit board mounted on a pogo pin tower for direct connection thereto.

FIG. 7 is an explode view of another embodiment of the probe assembly 32 connected to an electronic test equipment interface card 45. The probe pin contact array 46 includes a plurality of contact pads 47 arranged in mirror image array to the array of conductive through-pin ends (not shown) extending from the upper surface of the connector plate 33. The contact pads 47 are removably secured to the probe assembly to provide electrical communication between the contact pads and the plurality of probe pins 1. The probe assembly is removably secured to the interface card 45 using any suitable securing means including, but not limited to, bolts, clips, snaps, solder, and the like. A plurality of wire traces 47 carry the test signal from a respective one of the contact pads 46 to a respective one of a plurality of polar array contact pads 48. The characteristic impedance of each wire trace is controllable using well known techniques thereby permitting low impedance, and impedance matched transmission of signals from the probe pins 1 to electronic test equipment (not shown).

In view of the foregoing, it will be understood that the present invention provides an impedance balanced, pre-selected contact pressure wafer probe assembly as an electrical interface between semiconductor wafers and electronic test systems for determining the functional integrity and performance of integrated circuits. It will be evident that the probe assembly of this invention provides direct electrical communication between the probe pins populating the probe card and the line conductors connecting the pins to the electronic test equipment. The substantially direct connection to the electronic test systems enables control of the inductive and capacitive loads (characteristic impedance) of the signal path between the pins and the line conductors. As a result of smaller, more uniform, characteristic impedance, the probe assembly of this invention advantageously provides reduced signal attenuation, enhanced uniformity of signal strength, and higher digital signal frequency transmission capability as compared to wafer test probe assemblies presently available. Moreover, it is evident that testing semiconductor dies with higher digital test signal frequencies provides an enhanced assessment of the performance capabilities and functionalities of the device under test.

It will further be evident that the probe pin of this invention is fabricated from an elastic conductive material and includes a spring integral to the pin and formed along the medially located section of the pin. The spring is formed having a pre-determined shape to provide a predetermined strain, or vertical displacement of the pin, for a given stress, or contact force, exerted on the pin. In one embodiment, the spring is formed to advantageously provide a predetermined, constant contact force stress/strain profile whereby the contact force is approximately the same over a wide vertical displacement range. In this embodiment, the criticality of the planarity of the probe system's pin array relative to the device under test is significantly reduced as the contact force remains substantially constant across all probe pins. In another embodiment, a decreasing contact force with increasing vertical displacement permits control of the cumulative vertical force of the probe assembly on the wafer. It is also evident that in some embodiments, the constant cross-section shape of the probe pin of this facilitates the manufacture of the probe pin thereby reducing manufacturing costs.

It will further be evident that the tip of the probe pin of this invention is canted at a pre-selected angle such that vertical displacement of the probe pin creates an X, Y shear force component on the probe pin tip as against the semiconductor bond pad. It is also evident that the X, Y shear force may be pre-selected as it is dependent on predetermined contact force and the cant angle. The shear force in one embodiment is pre-selected to be sufficiently high so as to pierce the passivation layer overlying the semiconductor to thereby ensure low resistance electrical contact with the semiconductor bond pad, while minimizing gouging the contact pad element. Minimizing contact damage to the semiconductor contact pad elements results in less damage to wire bonds and reduces particulate contamination which in turn results in higher device yields.

It is also evident that the cant angle of the probe pin tip is decoupled from the spring geometry. Since the canted end of the probe pin is not part of the spring formed medially on the probe pin, the canted end and the probe pin spring are decoupled from one another. This decoupling permits selecting any cant angle, or forming any spring type without requiring design accommodations on the other element, thereby resulting in a wider range of contact force for a given contact angle of the probe pin with the semiconductor pad.

The probe card of this invention includes guide sleeves comprising through-holes bored through a lower plate. The guide sleeves are bored at the same angle as the canted end of the probe pin. The guide sleeves have an inside diameter sufficiently large to receive the canted end of the probe pin for a slidable, snug fit, thereby holding the canted end of the probe pin in fixed spatial relationship to the semiconductor pad element. It will be evident that the guide sleeves facilitate alignment of the probe pins during manufacturing and/or set up thereby simplifying the manufacturing process and reducing construction costs, and hold the probe pins in fixed spatial alignment thereby preventing contact between adjacent probe pins. It will also be evident that the guide sleeves have an inside dimension just slightly larger than the diameter or circumferential geometry, of the probe pin, thereby permitting high pin packing density (i.e., a smaller pitch). It will also be evident that the guide sleeve pitch is decoupled from the contact force since the geometry of the medially located spring is independent of the guide sleeve geometry.

It is also evident that the probe card of this array may be mounted directly to a probe spring contact array on a printed circuit board disposed on a polar array interface card. Optionally, a connector place may be used to interface the probe card of the present invention with the probe pin contact array, particularly in those cases where the connector plate is needed to accommodate size differences between the probe pin array on the probe card and the probe pin contact array of the interface card.

What is claimed is:

1. A probe pin for a wafer probe system, comprising an elastic, electrically conductive wire having a connector end, a tip end and a center section disposed between said connector end and said tip end, at least a portion of said center section formed into a spring to provide a contact force control area, and said tip end terminating in a probe tip wherein said tip end being canted at a predetermined cant angle from a longitudinal axis of the probe pin, said can angle being greater than 0 degrees to about 12 degrees from said longitudinal axis.

2. A probe pin as in claim 1 wherein said spring is formed to provide a contact force having a predetermined stress/strain profile.

3. A probe pin as in claim 2 wherein said spring is formed to provide an approximately constant stress force with increasing vertical displacement above an initial displacement distance of said probe tip.

4. A probe pin as in claim 2 wherein said spring is formed to provide a decreasing stress force with increasing vertical displacement above an initial vertical displacement distance of said probe tip.

5. A probe pin as in claim 1 wherein said electrically conductive wire is selected from metals, electrically conductive polymers and plastics, electrically conductive composite materials, and combinations thereof.

6. A probe pin as in claim 1 wherein said wire has a constant cross-section type.

7. A probe pin as in claim 4 wherein said wire is Paliney 7®.

8. A probe card for a wafer probe system, comprising in operative combination:
   a) an upper alignment plate, said upper alignment plate comprising a top surface and a bottom surface, and a plurality of through-holes perpendicular to said top and said bottom surface;
   b) a lower alignment plate, said lower alignment plate comprising a top surface and a bottom surface, and a plurality of through holed guide sleeves in mirror image alignment with said upper alignment plate through-holes, said guide sleeves having a longitudinal axis at a predetermined angle from a perpendicular between said lower plate top and bottom surfaces; and
   c) a plurality of probe pins, each of said probe pins comprising an elastic, electrically conductive wire having a connector end, a tip end and a center section disposed between said connector end and tip end, said center section being formed into a spring, and said tip end being canted from a longitudinal axis of the probe pin at an angle equal to said lower plate guide sleeve predetermined angle;

said tip of each of said plurality of probe pins being slidably disposed in a respective one of said guide sleeve, said guide sleeves having the same cross-section type as the cross-section of said tip end, said guide sleeve having a cross-section dimension sufficiently large to permit longitudinal movement of said tip end along said longitudinal axis of said guide sleeve with substantially no lateral motion of said tip end in said guide sleeve.

9. The probe card of claim 8 wherein said upper alignment plate and said lower alignment plate are in fixed coplanar spatial alignment, and each of said connector ends of said probe pins are snug-fit disposed in a respective one of said plurality of through-holes in said upper alignment plate to thereby provide a vertical array of probe pins, said probe pins aligned substantially perpendicularly to said upper and lower alignment plates.

10. The probe card of claim 9 wherein said probe pins are disposed in said vertical array in a mirror-image pattern to the layout pattern of the semiconductor bond pad elements to be engaged by said tip ends of said probe pins.

11. The probe card of claim 10 wherein each of said tips of said probe pins extend to a predetermined distance from said bottom surface of said lower plate to permit concurrent contact of each of said tip with a corresponding bond pad element on the semiconductor wafer.

12. The probe card of claim 11 wherein said spring is formed to provide a contact force having a predetermined stress/strain profile.

13. The probe card of claim 12 wherein said spring in each of said plurality of probe pins is formed to provide an approximately constant contact force with increasing vertical displacement above an initial displacement distance of said probe tips.

14. The probe card of claim 12 wherein said spring in each of said plurality of probe pins is formed to provide a decreasing contact force of said probe tips with increasing vertical displacement above an initial vertical displacement distance of said probe tips.

15. The probe card of claim 12 wherein said electrically conductive wire is selected from metals, conductive polymers and plastics, and metal impregnated plastic composites.

16. The probe card of claim 12 wherein said wire has a constant cross-section type.

17. A wafer probe system for testing semiconductor devices on a wafer, comprising in operative combination:
   a) a probe card as in claim 9, wherein said connector ends extend perpendicularly from said top surface of said upper alignment plate;
   b) a connector plate having a plurality of electrically conductive pins, said plurality of conductive pins arranged in mirror-image pattern to said through-holes in said upper alignment plate, said connector plate overlying said upper alignment plate and in fixed coplanar spatial alignment with said upper alignment plate to thereby urge said connector ends of said probe pins against a first end said conductive pins to permit electrical communication between said conductive pins and said connector ends of said plurality of probe pins; and
   c) a plurality of transmission lines, each one of said plurality of transmission lines in electrical communication with a second end of a respective one of said conductive pins to thereby permit electrical signal communication between each of said plurality of probe pins and electronic test equipment.

18. The wafer probe system of claim 17 wherein each one of said plurality of transmission lines has a predetermined characteristic impedance.

* * * * *